(12) United States Patent  
Robinson et al.

(10) Patent No.: US 7,604,843 B1
(45) Date of Patent: Oct. 20, 2009

(54) METALLIC DISPERSION (75) Inventors: Matthew R. Robinson, East Palo Alto, CA (US); Martin R. Roscheisen, San Francisco, CA (US)

(73) Assignee: Nanosolar, Inc., San Jose, CA (US)

( * ) Notice: Subject to any disclaimer, the term of this patent is extended or adjusted under 35 U.S.C. 154(b) by 561 days.

(21) Appl. No.: 11/081,163

(22) Filed: Mar. 16, 2005

(51) Int. Cl.
*B05D 3/04* (2006.01)
*H01L 31/00* (2006.01)

(52) U.S. Cl. .................. 427/376.6; 427/74; 427/76; 136/262; 136/264; 136/265; 977/786; 977/810

(58) Field of Classification Search ................. 136/262, 136/264, 265; 427/216, 217, 381, 180–206, 427/74, 76, 191, 376.6–376.8, 383.1; 106/286.1–286.8; 977/786, 810
See application file for complete search history.

(56) References Cited

U.S. PATENT DOCUMENTS

| | | | |
|---|---|---|---|
| 3,423,301 | A | 1/1969 | Sterns |
| 3,586,541 | A | 6/1971 | Chamberlin |
| 3,966,568 | A | 6/1976 | Crossley et al. |
| 4,191,794 | A | 3/1980 | Shirland et al. |
| 4,192,721 | A | 3/1980 | Fawcett et al. |
| 4,404,422 | A | 9/1983 | Green et al. |
| 4,522,663 | A | 6/1985 | Ovshinsky et al. |
| 4,536,607 | A | 8/1985 | Wiesmann |
| 4,622,432 | A | 11/1986 | Yamazaki |
| 4,642,140 | A | 2/1987 | Noufi et al. |
| 4,677,250 | A | 6/1987 | Barnett et al. |
| 4,806,436 | A | 2/1989 | Tada et al. |
| 4,940,604 | A | 7/1990 | Suyama et al. |
| 5,013,464 | A | 5/1991 | Sugimura et al. |
| 5,045,409 | A | 9/1991 | Eberspacher et al. |
| 5,078,804 | A | 1/1992 | Chen et al. |
| 5,141,564 | A | 8/1992 | Chen et al. |
| 5,244,509 | A | 9/1993 | Arao et al. |
| 5,277,786 | A | 1/1994 | Kawakami |
| 5,286,306 | A | 2/1994 | Menezes |
| 5,356,839 | A | 10/1994 | Tuttle et al. |
| 5,401,573 | A | 3/1995 | Babel et al. |
| 5,419,781 | A | 5/1995 | Hamakawa et al. |
| 5,436,204 | A | 7/1995 | Albin et al. |

(Continued)

FOREIGN PATENT DOCUMENTS

DE 2741954 3/1979

(Continued)

OTHER PUBLICATIONS

Definition of "globule" Oxford English Dictionary Online. 2nd edition, 1989.*

(Continued)

*Primary Examiner*—Jeffrey T. Barton (57) ABSTRACT

A compound film may be formed by formulating a mixture of elemental nanoparticles composed of the Ib, the IIIa, and, optionally, the VIa group of elements having a controlled overall composition. The nanoparticle mixture is combined with a suspension of nanoglobules of gallium to form a dispersion. The dispersion may be deposited onto a substrate to form a layer on the substrate. The layer may then be reacted in a suitable atmosphere to form the compound film. The compound film may be used as a light-absorbing layer in a photovoltaic device.

38 Claims, 2 Drawing Sheets

U.S. PATENT DOCUMENTS

| | | | |
|---|---|---|---|
| 5,441,897 A | 8/1995 | Noufi et al. | |
| 5,445,847 A | 8/1995 | Wada et al. | 427/74 |
| 5,538,903 A | 7/1996 | Aramoto et al. | 438/94 |
| 5,567,469 A | 10/1996 | Wada et al. | 427/74 |
| 5,578,503 A | 11/1996 | Karg et al. | |
| 5,626,688 A | 5/1997 | Probst et al. | |
| 5,633,033 A | 5/1997 | Nishitani et al. | |
| 5,677,250 A | 10/1997 | Knapp | |
| 5,728,231 A | 3/1998 | Negami et al. | 148/33 |
| 5,730,852 A | 3/1998 | Bhattacharya et al. | |
| 5,925,228 A | 7/1999 | Panitz et al. | |
| 5,985,691 A | 11/1999 | Basol et al. | 438/95 |
| 5,994,163 A | 11/1999 | Bodegard et al. | |
| 6,022,487 A | 2/2000 | Daume et al. | |
| 6,107,562 A | 8/2000 | Hashimoto et al. | |
| 6,121,541 A | 9/2000 | Arya | |
| 6,124,039 A | 9/2000 | Goetz et al. | |
| 6,124,041 A | 9/2000 | Aoude et al. | 428/472 |
| 6,126,740 A | 10/2000 | Schulz et al. | 117/4 |
| 6,127,202 A | 10/2000 | Kapur et al. | 438/47 |
| 6,228,904 B1 | 5/2001 | Yadav et al. | 523/210 |
| 6,268,014 B1 | 7/2001 | Eberspacher et al. | 427/74 |
| 6,323,417 B1 | 11/2001 | Gillespie et al. | 136/262 |
| 6,344,272 B1 | 2/2002 | Oldenburg et al. | |
| 6,454,886 B1 | 9/2002 | Martin et al. | 149/2 |
| 6,472,459 B2 | 10/2002 | Morales et al. | 524/439 |
| 6,518,086 B2 | 2/2003 | Beck et al. | |
| 6,593,690 B1 | 7/2003 | McCormick et al. | |
| 6,641,898 B2 | 11/2003 | Yazaki et al. | |
| 6,685,986 B2 | 2/2004 | Oldenburg et al. | |
| 6,897,603 B2 | 5/2005 | Mao et al. | |
| 6,974,976 B2 | 12/2005 | Hollars | |
| 7,144,627 B2 | 12/2006 | Halas et al. | |
| 2002/0006470 A1 | 1/2002 | Eberspacher et al. | 427/216 |
| 2002/0132045 A1 | 9/2002 | Halas et al. | |
| 2002/0160195 A1 | 10/2002 | Halas et al. | |
| 2002/0187347 A1 | 12/2002 | Halas et al. | |
| 2003/0051664 A1 | 3/2003 | Stanbery | |
| 2003/0052382 A1 | 3/2003 | Stanbery | |
| 2003/0052391 A1 | 3/2003 | Stanbery | |
| 2003/0054582 A1 | 3/2003 | Stanbery | |
| 2003/0054661 A1 | 3/2003 | Stanbery | |
| 2003/0054662 A1 | 3/2003 | Stanbery | |
| 2003/0054663 A1 | 3/2003 | Stanbery | |
| 2003/0192584 A1 | 10/2003 | Montello et al. | |
| 2003/0205270 A1 | 11/2003 | Stanbery | |
| 2003/0211646 A1 | 11/2003 | Stanbery | |
| 2004/0144419 A1 | 7/2004 | Fix et al. | |
| 2004/0214001 A1 | 10/2004 | Oldenburg et al. | |
| 2004/0219730 A1 | 11/2004 | Basol | 438/200 |
| 2005/0022747 A1 | 2/2005 | Stanbery | |
| 2005/0035983 A1 | 2/2005 | Cruchon-Dupeyrat et al. | |
| 2005/0058587 A1 | 3/2005 | Wagner | |
| 2005/0150789 A1 | 7/2005 | Crane | |
| 2005/0175836 A1 | 8/2005 | Kuehnle et al. | |
| 2005/0183767 A1* | 8/2005 | Yu et al. | 136/263 |
| 2005/0183768 A1 | 8/2005 | Roscheisen et al. | |
| 2005/0186342 A1 | 8/2005 | Sager et al. | |
| 2005/0186805 A1 | 8/2005 | Stanbery | |
| 2005/0194036 A1 | 9/2005 | Basol | |
| 2005/0194038 A1 | 9/2005 | Brabec et al. | |
| 2005/0202589 A1 | 9/2005 | Basol | |
| 2005/0235869 A1 | 10/2005 | Cruchon-Dupeyrat et al. | |
| 2005/0247340 A1 | 11/2005 | Zeira | |
| 2005/0266600 A1 | 12/2005 | Basol | |
| 2005/0268962 A1 | 12/2005 | Gaudiana et al. | |
| 2005/0272263 A1 | 12/2005 | Brabec et al. | |
| 2006/0054506 A1 | 3/2006 | Natan et al. | |
| 2006/0099146 A1 | 5/2006 | Chow et al. | |
| 2006/0121701 A1 | 6/2006 | Basol | |
| 2006/0134505 A1 | 6/2006 | Wang et al. | |
| 2006/0165911 A1 | 7/2006 | Basol | |
| 2006/0178012 A1 | 8/2006 | Basol | |
| 2006/0189155 A1 | 8/2006 | Basol | |
| 2006/0192955 A1 | 8/2006 | Jorgenson et al. | |
| 2006/0207644 A1 | 9/2006 | Robinson et al. | |
| 2006/0251874 A1 | 11/2006 | McClure et al. | |
| 2007/0044834 A1 | 3/2007 | Berke et al. | |
| 2007/0092648 A1 | 4/2007 | Duren et al. | |
| 2007/0093006 A1 | 4/2007 | Basol | |
| 2007/0093059 A1 | 4/2007 | Basol | |
| 2007/0111367 A1 | 5/2007 | Basol | |
| 2007/0145507 A1 | 6/2007 | Basol | |
| 2007/0163383 A1 | 7/2007 | Van Duren et al. | |
| 2007/0163637 A1 | 7/2007 | Robinson et al. | |
| 2007/0163638 A1 | 7/2007 | Van Duren et al. | |
| 2007/0163639 A1 | 7/2007 | Robinson et al. | |
| 2007/0163640 A1 | 7/2007 | Van Duren et al. | |
| 2007/0163642 A1 | 7/2007 | Van Duren et al. | |
| 2007/0163643 A1 | 7/2007 | Van Duren et al. | |
| 2007/0163644 A1 | 7/2007 | Van Duren et al. | |
| 2007/0166453 A1 | 7/2007 | Van Duren et al. | |
| 2007/0166964 A1 | 7/2007 | Basol | |
| 2007/0169809 A1 | 7/2007 | Van Duren et al. | |
| 2007/0169810 A1 | 7/2007 | Van Duren et al. | |
| 2007/0169811 A1 | 7/2007 | Van Duren et al. | |
| 2007/0169812 A1 | 7/2007 | Robinson et al. | |
| 2007/0169813 A1 | 7/2007 | Robinson et al. | |
| 2007/0178620 A1 | 8/2007 | Basol | |
| 2008/0121277 A1 | 5/2008 | Robinson et al. | |
| 2008/0124831 A1 | 5/2008 | Robinson et al. | |

FOREIGN PATENT DOCUMENTS

| | | |
|---|---|---|
| EP | 793277 | 9/1997 |
| JP | 61244004 | 10/1986 |
| JP | 62-89369 | 4/1987 |
| JP | 63-249379 | 10/1988 |
| JP | 2001-044464 * | 2/2001 |
| KR | 2005119705 A | 12/2005 |
| WO | WO 02/084708 A2 * | 10/2002 |
| WO | WO 03/007386 | 1/2003 |
| WO | WO 03/043736 A2 | 5/2003 |

OTHER PUBLICATIONS

U.S. Appl. No. 10/782,017, titled "Solution-Based Fabrication of Photovoltaic Cell", filed Feb. 19, 2004.

U.S. Appl. No. 10/943,658, titled "Formation of Cigs Absorber Layer Materials Using Atomic Layer Deposition and High Throughput Surface Treatment", filed Sep. 18, 2004.

S. L. Castro et. al. "Nanocrystalline Chalcopyrite Materials ($CuInS_2$ and $CuInSe_2$) via Low-Temperature Pyrolysis of Molecular Single-Source Precursors" *Chem. Mater*, vol. 15, pp. 3142-3147, 2003.

B. A. Ridley et al, "All-Inorganic Field Effect Transistors Fabricated by Printing" in *Science*, vol. 286, pp. 746-749, Oct. 22, 1999.

J. Zhu, et al, "General Sonochemical Method for the Preparation of Nanophasic Selenides: Synthesis of ZnSe Nanoparticles" in *Chem. Mater.* 2000, vol. 12, pp. 73-78.

B. Li, et al. "Synthesis by a Solvothermal Route and Characterization of CuInSe2 Nanowhiskers and Nanoparticles" in *Advanced Materials*, vol. 11, No. 17, pp. 1456-1459, 1999, Wiley-VCH Verlag GmbH.

P. Sen, et al., "Preparation of Cu, Ag, Fe and Al nanoparticles by the exploding wire technique" in *Proc. Indian Acad. Sci. (Chem. Sci.)*, vol. 115, Nos. 5 & 6, pp. 499-508, Oct.-Dec. 2003, Indian Academy of Sciences.

M. A. Malik et al. "A Novel Route for the Preparation of CuSe and CuInSe2 Nanoparticles" in *Advanced Materials*, vol. 11, No. 17, pp. 1441-1444, Wiley-VCH Verlag GmbH, Weinheim.

K. K. Banger et al. "Synthesis and Characterization of the First Liquid Single-Source Precursors for the Deposition of Ternary Chalcopyrite (CuInS2) Thin Film Materials" in *Chem. Mater.*, vol. 13, 3827-3829, 2001, American Chemical Society.

Granqvist, C.g. and R.A. Buhrman. "Ultafine metal particles". J. Applied Physics 47 (5): 220-2219 (1976).

F. Tepper et al, "Nanosized Alumina Fibers", *Advanced Materials*, American Ceramic Society Bulletin, vol. 80, No. 6, Jun. 2001.

Subramanian, P.R. and Laughlin, D.E., in*Binary Alloy Phase Diagrams, 2nd Edition*, edited by Massalski, T.B. 1990. ASM international, Materials Park, OH, pp. 1410-1412.

Ag-Ga adn Cu-Ga Phase Diagrams. Nov. 1999.

Vijay K. Kapur, Ashish Bansal, Phucan Le, and Omar I. Asensio, Non-vacuum processing of $CuIn_{1-x}Ga_xSe_2$ solar cells on rigid and flexible substrates using nanoparticle precursor inks, Thin Solid Films, 2003, 53-57, vol. 431-432, Elsevier Publishing Company, Amsterdam.

Markus E. Beck, and Michael Cocivera, Thin-film copper indium diselenide prepared by selenization of copper indium oxide formed by spray pyrolysis, Thin Solid Films, 1996, 71-82, vol. 272, Elsevier Publishing Company, Amsterdam.

C. Eberspacher, K. Pauls, and J. Serra, Non-vacuum processing of CIGS solar cells, UNISUN, 223-224, 2001, Newbury Park, CA.

T. Arita, N. Suyama, Y. Kita, S. Kitamura, T. Hibino, H. Takada, K. Omura, N. Ueno, and M. Murozono, $CuInSe_2$ films prepared by screen-printing and sintering method, 1988, IEEE.

Douglas L. Schulz, Calvin J. Curtis, Rebecca A. Flitton, Holm Wiesner, James Keane, Richard J. Matson, Kim M. Jones, Philip A. Parilla, Rommel Noufi, and David S. Ginley, Cu-In-Ga-Se Nanoparticle Colloids as Spray Deposition Precursors for Cu(In, Ga)$Se_2$ Solar Cell Materials, Journal of Electronic Materials, 1998, 433-437, vol. 27, No. 5, Minerals Metals & Materials Society : USA.

Claire J. Carmalt, Daniel E. Morrison, and Ivan P. Parkin, Solid-state and solution phase metathetical synthesis of copper indium chalcogenides, Journal of Materials Chemistry, 1998, 2209-2211, vol. 8, No. 10, Royal Society of Chemistry (Great Britain).

Shixing Weng and Michael Cocivera, Preparation of copper indium diselenide by selenization of copper indium oxide, Journal of Applied Physics, Aug. 1, 1993, 2046-2052, vol. 74, No. 3, American Institute of Physics, New York.

G.. Norsworthy, C.R. Leidholm, A. Halani, V.K. Kapur, R. Roe, B.M. Basol, and R. Matson, CIS film growth by metallic ink coating and selenization, Solar Energy Materials & Solar Cells, 2000, 127-134, vol. 60, Elsevier Science, Amsterdam : Netherlands.

Chris Eberspacher, Chris Fredric, Karen Pauls, and Jack Serra, Thin-filme CIS alloy PV materials fabricated using non-vacuum, particles-based techniques, Thin Solid Films, 2001, 18-22, vol. 387, Elsevier Publishing Company, Amsterdam.

C. Eberspacher, K. L. Pauls and C. V. Fredric, Improved processes for forming $CuInSe_2$ films, UNISUN, 1-4, Newbury Park, CA.

Chris Eberspacher, Karen L. Pauls, and John P. Serra, Non-vacuum thin-film CIGS modules, Materials Research Society Symposia Proceedings, 2003, B8.27.1-B8.27.6, vol. 763, Materials Research Society, Warrendale, PA.

M. Kaelin, D. Rudmann, F. Kurdesau, T. Meyer, H. Zogg, A.N. Tiwari, CIS and CIGS layers from selenized nanoparticle precursors, Thin Solid Films, 2003, 58-62, vol. 431-432, Elsevier Science, Amsterdam : Netherlands.

M. Kaelin, H. Zogg, A.N. Tiwari, O. Wilhelm, S.E. Pratsinis, T. Meyer, and A. Meyer, Electrosprayer and selenized Cu/In metal particle films, Thin Solid Films, 2004, 391-396, vol. 457, Elsevier Science, Amsterdam : Netherlands.

R.P. Raffaelle, J.G. Mantovani, S.G. Bailey, A.F. Hepp, E.M. Gordon and R. Haraway, Electrodeposited $CuInSe_2$ thin film junctions, Prepared for the 1997 Fall meeting sponsored by the Materials Research Society, Dec. 1-5, 1997, Boston, MA.

K.T. Ramakrishna Reddy, R.B.V. Chalapathy, M.A. Slifkin, A.W. Weiss, and R.W. Miles, Photoacousstic spectroscopy of sprayed $CuGa_xIn_{1-x}Se_2$ thin films, Thin Solid Films, 2001, 205-207, vol. 387, Elsevier Science, Amsterdam : Netherlands.

C. Guillen, and J. Herrero, Recrystallization and components redistribution processes in electrodeposited $CuInSe_2$ thin films, Thin Solid Films, 2001, 57-59, vol. 387, Elsevier Science, Amsterdam : Netherlands.

K.T.L. De Silva, W.A.A. Priyantha, J.K.D.S. Jayanetti, B.D. Chithrani, W. Siripala, K. Blake, and I.M. Dharmadasa, Electrodeposition and characterization of $CuInSe_2$ for applications in thin film solar cells, Thin Solid Films, 2001, 158-163, vol. 382, Elsevier Science, Amsterdam : Netherlands.

A. G. Munoz, S. B. Saidman, and J. B. Bessone, Electrodeposition of Indium onto Vitreous Carbon from Acid Chloride Solutions, Journal of The Electrochemical Society, 1999, 2123-2130, vol. 146, No. 6, Electrochemical Society Inc : USA.

D. Padhi, J. Yahalom, S. Gandikota, and G. Dixit, Planarization of Copper Thin Films by Electropolishing in Phosphoric Acid for ULSI Applications, Journal of the Electrochemical Society, 2003, G10-G14, vol. 150, No. 1, Electrochemical Society Inc : USA.

George L. Schnable and John G. Javes, Electrodeposition of Molten Low-Melting Metals and Alloys from Fused-Salt Systems, Electrochemical Technology, Jul.-Aug. 1964, 201-206, Electrochemical Society, Manchester, N.H.

George L. Schnable, Electrodeposition of Molten Metals and Alloys from Glycerine Solutions, Journal of the Electrochemical Society, Oct. 1961, 964-969, vol. 108, No. 10, Electrochemical Society Inc : USA.

William M. Saltman and Norman H. Nachtrieb, The Electrochemistry of Gallium, Journal of the Electrochemical Society, Mar. 1953, 126-130, vol. 100, No. 3, Electrochemical Society Inc: USA.

Marianna Kemell, Heini Saloniemi, Mikko Ritala, and Markku Leskela, Electrochemical Quartz Crystal Microbalance Study of the Electrodeposition Mechanisms of $CuInSe_2$ Thin Films, Journal of The Electrochemical Society, 2001, C110-C118, vol. 148, No. 2, Electrochemical Society: USA.

A. Kampmann, P. Cowache, D. Lincot, and J. Vedel, Juction Formation Studies of One-Step Electrodeposited $CuInSe_2$ on CdS, Journal of The Electrochemical Society, 1999, 150-155, vol. 146, No. 1, Royal Society of Chemistry (Great Britain).

C. Eberspacher, K. Pauls, and J. Serra, Non-vacuum processing of CIGS solar cells, Unisun, pp. 1-5, 2003 Newbury Park, CA.

Yasuto Miyazawa and G. M. Pound, Homogeneous Nucleation of Crystalline Gallium From Liquid Gallium, Journal of Crystal Growth 23 (1974) 45-57.

L. Bosio and C. G. Windsor, Observation of a Metastability Limit in Liquid Gallium, Physical Review Letters, vol. 35, No. 24, Dec. 15, 1975.

Di Cicco, Andrea, Phase Transitions in Confined Gallium Droplets, Physical Review Letters (1998), 81(14), 2942-2945. Publisher: American Physical Society.

Poloni, R.; De Panfilis, S.; Di Cicco, A.; Pratesi, G.; Principi, E.; Trapananti, A.; Filipponi, A., Liquid gallium in confined droplets under high-temperature and high-pressure conditions, Physical Review B 71. 184111 (2005).

Di Cicco, A.; Fusari, S.; Stizza, S., Phase transitions and undercooling in confined gallium, Philosophical Magazine B: Physics of Condensed Matter: Statistical Mechanics, Electronic, Optical and Magnetic Properties (1999), 79(11/12), 2113-2120. Publisher: Taylor & Francis Ltd.

Heyding, R. D.; Keeney, W.; Segel, S.L., Metastable phases in gallium dispersions, Journal of Physics and Chemistry of Solids (1973), 34(1), 133-6.

Lee, Y.; Wang, T.; Liu, Y.; Ao, J.; Li, H.; Sato, H.; Nishino, K.; Naoi, Y.; Sakai, S., Fabrication of high-output-power AIGaN/GaN-based UV-light-emitting diode using a Ga droplet layer, Japanese Journal of Applied Physics, Part 2: Letters (2002), 41(10A), L1037-L1039.

Schwarcz, D.; Nakahara, S.; Ohring, M., TEM observations of early nucleation and growth stages in aluminum films on liquid gallium droplets, Thin Solid Films (1994), 245(1-2), 260-6.

Karpov, S. Y.; Bord, O. V.; Talalaev, R. A.; Makarov, Y. N., Gallium droplet formation during MOVPE and thermal annealing of GaN, Materials Science & Engineering, B: Solid-State Materials for Advanced Technology (2001), B82(1-3), 22-24.

Berty, J.; David, M. J.; Lafourcade, L.; Defrain, A., Electron diffraction study of the supercooling of very small gallium droplets, Scripta Metallurgica (1976), 10(7), 645-8.

Huang, J. B.; Fei, G. T.; Shui, J. P.; Cui, P.; Wang, Y. Z., Preparation and internal friction of nanoscale gallium droplets, Physica Status Solidi A: Applied Research (2002), 194(1), 167-172.

U.S. Appl. No. 11/933,136, filed Oct. 31, 2007, titled "Solution-based Fabrication of Photovoltaic Cell".

U.S. Appl. No. 11/933,255, filed Oct. 31, 2007, titled "Solution-based Fabrication of Photovoltaic Cell".

U.S. Appl. No. 11/933,285, filed Oct. 31, 2007, titled "Solution-based Fabrication of Photovoltaic Cell".
U.S. Appl. No. 11/933,315, filed Oct. 31, 2007, titled "Solution-based Fabrication of Photovoltaic Cell".
U.S. Appl. No. 11/933,322, filed Oct. 31, 2007, titled "Solution-based Fabrication of Photovoltaic Cell".
U.S. Appl. No. 11/933,338, filed Oct. 31, 2007, titled "Solution-based Fabrication of Photovoltaic Cell".
U.S. Appl. No. 11/933,357, filed Oct. 31, 2007, titled "Solution-based Fabrication of Photovoltaic Cell".
U.S. Appl. No. 11/933,375, filed Oct. 31, 2007, titled "Solution-based Fabrication of Photovoltaic Cell".
U.S. Appl. No. 11/933,400, filed Oct. 31, 2007, titled "Solution-based Fabrication of Photovoltaic Cell".
U.S. Appl. No. 11/933,407, filed Oct. 31, 2007, titled "Solution-based Fabrication of Photovoltaic Cell".
U.S. Appl. No. 11/396,199, filed Mar. 30, 2006, titled "Dispersion Using Inter-metallic Materials".
U.S. Appl. No. 12/095,463, filed May 29, 2008, titled "Chalcogenide Solar Cell".
Freeman et al., Ag-Clad Au Nanoparticles: Novel Aggregation, Optical, and Surface-Enhanced Raman Scattering Properties J. Phys. Chem., vol. 100, 1996, pp. 718-724.

Office Action from U.S. Appl. No. 10/836,307, dated Apr. 5, 2007.
Office Action from U.S. Appl. No. 10/836,307, dated Jun. 11, 2008.
Office Action from U.S. Appl. No. 10/782,017, Dec. 31, 2007.
Office Action from U.S. Appl. No. 11/290,633, Jan. 7, 2009.
Office Action from U.S. Appl. No. 11/361,522, Dec. 24, 2008.
Office Action from U.S. Appl. No. 11/361,498, Jan. 29, 2009.
Office Action from U.S. Appl. No. 11/361,433, Jul. 15, 2008.
Office Action from U.S. Appl. No. 11/361,521, Feb. 25, 2009.
Office Action from U.S. Appl. No. 11/361,497, Mar. 10, 2009.
Office Action from U.S. Appl. No. 11/361,515, Dec. 12, 2008.
Office Action from U.S. Appl. No. 11/361,523, Dec. 26, 2008.
Office Action from U.S. Appl. No. 11/361,103, Jan. 29, 2009.
Office Action from U.S. Appl. No. 11/361,688, Aug. 26, 2008.
Office Action from U.S. Appl. No. 11/362,266, Jul. 29, 2008.
Office Action from U.S. Appl. No. 11/395,438, Dec. 23, 2008.
Office Action from U.S. Appl. No. 11/395,426, Feb. 9, 2009.
Office Action from U.S. Appl. No. 11/395,668, Dec. 23, 2008.
Office Action from U.S. Appl. No. 11/933,375, Jul. 31, 2008.
Office Action from U.S. Appl. No. 11/933,400, Apr. 1, 2009.
Final Office Action from U.S. Appl. No. 11/362,266, Apr. 10, 2009.

* cited by examiner

METALLIC DISPERSION

FIELD OF THE INVENTION

This invention generally relates to metallic dispersions and more particularly to metallic dispersions used to form the light-absorbing layers in photovoltaic devices.

BACKGROUND OF THE INVENTION

Solar cells convert sunlight into electricity. These electronic devices have been traditionally fabricated using silicon (Si) as a light-absorbing, semiconducting material in a relatively expensive production process. To make solar cells more economically viable, solar cell device architectures have been developed that can inexpensively make use of thin-film, light-absorbing semiconductor materials such as copper-indium-gallium-sulfo-di-selenide, $Cu(In,Ga)(S,Se)_2$, also termed CI(G)S(S). This class of solar cells typically have an absorber layer sandwiched between an electrode layer and a junction partner layer. The electrode layer is often Mo, while the junction partner is often CdS. A transparent conductive oxide (TCO) such as zinc oxide ($ZnO_x$) is formed on the junction partner layer is typically used as a transparent electrode. CIS-based solar cells have been demonstrated to have power conversion efficiencies exceeding 19%.

A central challenge in efficiently constructing a CIGS-based solar cell is that the components of the CIGS layer must be within a narrow stoichiometric ratio in order for the resulting cell to be highly efficient. Achieving precise stoichiometric composition over relatively larger substrate areas is however difficult using traditional vacuum-based deposition processes. For example, it is difficult to deposit compounds and/or alloys containing more than one element by sputtering or evaporation. Both techniques rely on deposition approaches that are limited to line-of-sight and limited-area sources, tending to result in poor surface coverage. Line-of-sight trajectories and limited-area sources can result non-uniform three-dimensional distribution of nanoparticles in all three dimensions and/or poor film-thickness uniformity over large areas. These non-uniformities can occur over the nano-meso, and/or macroscopic scales. Such non-uniformity also alters the local stoichiometric ratios of the absorber layer, decreasing the potential power conversion efficiency of the complete device.

Alternative approaches to vacuum-based deposition techniques such as sputtering and evaporation have been developed. In particular, production of solar cells on flexible substrates using semiconductor printing technologies provides a highly cost-efficient alternative to conventional vacuum-deposited solar cells. For example, T. Arita and coworkers [20th IEEE PV Specialists Conference, 1988, page 1650] described a screen printing technique that involved mixing and milling pure Cu, In and Se powders in the compositional ratio of 1:1:2 and forming a screen printable paste, screen printing the paste on a substrate, and sintering this film to form the compound layer. They reported that although they had started with elemental Cu, In and Se powders, after the milling step the paste contained the $CuInSe_2$ phase. However, solar cells fabricated on the sintered layers had very low efficiencies because the structural and electronic quality of these absorbers were poor.

Screen-printed $CuInSe_2$ deposited in a thin-film was also reported by A. Vervaet et al. [9th European Communities PV Solar Energy Conference, 1989, page 480], where a $CuInSe_2$ powder was used along with Se powder to prepare a screen printable paste. Layers formed by screen printing were sintered at high temperature. A difficulty in this approach was finding an appropriate fluxing agent for dense $CuInSe_2$ film formation. Solar cells made in this manner also had poor conversion efficiencies.

U.S. Pat. No. 5,985,691 issued to B. M. Basol et al describes another particle-based method to form a Group IB-IIIA-VIA compound film. The described method includes the steps of preparing a source material, depositing the source material on a base to form a precursor, and heating the precursor to form a film. In that method the source material includes Group IB-IIIA containing particles having at least one Group IB-IIIA phase, with Group IB-IIIA constituents present at greater than about 50 molar percent of the Group IB elements and greater than about 50 molar percent of the Group IIIA elements in the source material. The powder is milled to reduce its particle size and then used in the preparation of an ink which is deposited on the substrate in the form of a precursor layer. The precursor layer is then exposed to an atmosphere containing Group VIA vapors at elevated temperatures to convert the film into the compound. The precursor films deposited using this technique were porous and they yielded porous $CuInSe_2$ layers with small-grain regions as reported by G. Norsworthy et al. [Solar Energy Materials and Solar Cells, 2000, vol. 60, page 127]. Porous solar cell absorbers yield unstable devices because of the large internal surface area within the device, and small grains limit the conversion efficiency of solar cells. Another key limitation of this method was the inability to effectively incorporate gallium into the material. The properly-distributed presence of gallium in a CIS film serves to potentially broaden the bandgap of the semiconductor material, thereby increasing the open circuit voltage of the solar cell, and to promote the adhesion of the CIGS layer to a (Mo) electrode, providing a back surface electric field which can improve the collection of carriers. The absence of gallium decreases the potential power conversion efficiency of the solar cell. In practice, while gallium oxide particles can easily be produced, it is very difficult to reduce gallium oxide, even at relatively high temperatures, and in the absence of reduction, gallium oxide cannot be effectively used as a precursor material for gallium in the final film. Accordingly, in addition to poor stability, solar cells made using the approach of Basol et al. had sub-optimal power conversion efficiency.

Eberspacher and Pauls in U.S. Pat. No. 6,821,559 describe a process for making phase-stabilized precursors in the form of fine particles, such as sub-micron multinary metal particles, and multi-phase mixed-metal particles comprising at least one metal oxide. The preparation of particulate materials was described using a range of methods including laser pyrolysis, atmospheric arc evaporation, solution precipitation, chemical vapor reactions, aerosol pyrolysis, vapor condensation, and laser ablation. In particular, aerosol pyrolysis was used to synthesize mixed-metal particulates comprising metal oxides formed as substantially solid and spherical particulates. These particulate precursor materials were then deposited onto large-area substrates in thin layers using any of a variety of techniques including slurry spraying methods such as pneumatic spraying with a pressurized gas nozzle, hydraulic spraying with a pressurized slurry expelled through an orifice, and ultrasonic spraying with a rapidly vibrating atomization surface. A disadvantage of solar cell devices comprised of thin-film absorber layers formed in this manner was the poor reproducibility of the resulting device performance, and the porous form of the absorber layer, which tends to result in poor device stability.

Bulent Basol in U.S. Published Patent application number 20040219730 describes a process of forming a compound film including formulating a nano-powder material with a controlled overall composition and having particles of one solid solution. The nano-powder material is deposited on a substrate to form a layer on the substrate, and this layer is reacted in at least one suitable atmosphere to form the compound. According to one preferred embodiment of that process, the compound film has a Cu/(In+Ga) compositional range of 0.7-1.0 and a Ga/(In+Ga) compositional range of 0.05-0.3. Due to the improved process window made available by the phase space of a solid solution, the use of nanoparticles comprised of a solid solution may improve the repeatability and the overall yield of the thin-film deposition and solar cell production process. However, a means to incorporate additional Ga beyond that possible through a solid-solution (containing either Cu+Ga or In+Ga) restricts the potential performance of a device constructed by this method. In particular, since the presence of additional gallium in the light absorbing film serves both to broaden the bandgap of the semiconductor material and to increase the open circuit voltage of the solar cell, a lack of additional gallium in the light-absorbing thin film tends to decrease the potential power conversion efficiency of solar cells created in this manner. Using the solid-solution approach, Gallium can be incorporated into the metallic dispersion in non-oxide form—but only with up to approximately 18 relative atomic percent (Subramanian, P. R. and Laughlin, D. E., in *Binary Alloy Phase Diagrams, $2^{nd}$ Edition*, edited by Massalski, T. B. 1990. ASM international, Materials Park, Ohio, pp 1410-1412; Hansen, M., Constitution of Binary Alloys. 1958. $2^{nd}$ Edition, McGraw Hill, pp. 582-584.). However, efficient CIGS solar cells benefit from achieving a gallium ratio of up to 25 relative atomic percent. Furthermore, it would be simpler to directly work with elemental metallic nanoparticles rather than solid-solution metallic nanoparticles in that the elements can be optimized individually and they are more readily available in elemental form. However, no technique was known in the prior art to create gallium nanoparticle powders sufficient and adequate for semiconductor applications, in part because gallium is molten at room temperature and therefore does not lend itself to common techniques for creating nanoparticles in the form of powders that are then dispersed in solution (as commonly done with the other elements). As a result, it was not possible in the prior art to directly incorporate gallium (or incorporate gallium in a high percentage) into the metallic dispersion used to print the CIG precursor of a CIGS solar cell.

Thus, there is a need in the art for a method of forming a material comprised of gallium-containing CIGS precursor materials, where the precursor materials can be reproducibly, uniformly, and densely applied over large substrate areas to form a thin-film CIGS solar cell, and where the gallium is directly included in an elemental form.

SUMMARY OF THE INVENTION

The disadvantages associated with the prior art are overcome by embodiments of the present invention directed to the synthesis of a metallic dispersion of CIGS precursor materials. According to one embodiment a compound film may be formed from a mixture of elemental nanoparticles composed of the Ib, the IIIa, and, optionally, the VIa group of elements having a controlled overall composition where the nanoparticle mixture is combined with a suspension of nanoglobules of gallium. The dispersion may be deposited onto a substrate to form a layer on the substrate. The layer may then be reacted in a suitable atmosphere to form the compound film. The compound film may be used as the light-absorbing layer of a photovoltaic device.

DETAILED DESCRIPTION OF THE INVENTION

Metallic Dispersion

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

To form a Ib-IIIa-VIa compound film for use as a light-absorbing layer in a photovoltaic device, embodiments of the invention use a composition of matter in the form of a dispersion containing a mixture of elemental nanoparticles of the Ib, the IIIa, and, optionally, the VIa group of elements, dispersed with a suspension of nanoglobules of gallium. Based on the relative ratios of input elements, the gallium nanoglobule-containing dispersion can then have a Cu/(In+Ga) compositional ratio ranging from 0.01 to 1.0 and a Ga/(In+Ga) compositional ratio ranging from 0.01 to 1.0.

Figure 1A:
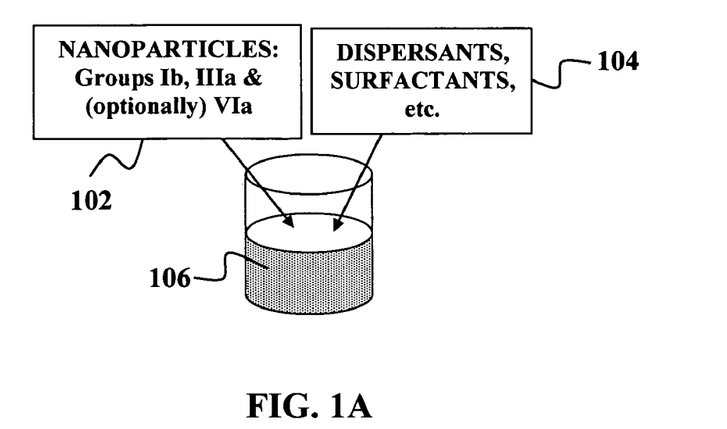
FIGS. 1A-1E are a sequence of schematic diagrams depicting the formation of a composition of matter according to an embodiment of the present invention.

As illustrated in FIG. 1A a mixture 106 of elemental nanoparticles 102 of the Ib, the IIIa, and, optionally, the VIa group of elements is formed by combining nanoparticles 102 comprised of the element of the Ib group of elements (e.g. copper) with nanoparticles comprised of the element of the IIIa group of elements (e.g. indium) and optionally nanoparticles comprised of the VIa group of elements (e.g. selenium and/or sulfur).

The mixture of elemental nanoparticles 102 may optionally include aluminum, tellurium, or sulfur. Any or all of these classes of nanoparticles may be optionally doped with one or more inorganic materials. Examples of such inorganic materials include but are not limited to aluminum (Al), sulfur (S), sodium (Na), potassium (K), or lithium (Li). The nanoparticles 102 typically have average diameters ranging from 10 nm to 1000 nm, more preferably from 10 nm to 500 nm, and most preferably, from 10 nm to 100 nm. Preferably, the nanoparticles are less than about 500 nm in diameter, more preferably less than about 100 nm and even more preferably less than about 50 nm. Various techniques may be used for making such nanoparticles, including but not limited to dry-synthesis techniques such as evaporation-condensation (Granqvist and Buhrman, 1976, "Ultrafine metal particles", J. Applied Physics 47 (5): 220-2219, which is incorporated herein by reference) and the electro-explosion of wire (Tepper, "Nanosized Alumina Fibers", *Advanced Materials*, American Ceramic Society Bulletin, Vol. 80, No. 6, June 2001, which is incorporated herein by reference), and wet chemical techniques, including but not limited to thermal decomposition of organometallic precursors (Hambrock et al., , 2002, Chem. Commun. 68-69, which is incorporated by reference) and metal salt reduction (Cai et al., 2004. Applied Surface Science 226: 422-426; Capek, 2004. Adv. In Colloid and Interface Science 110: 49-74, both of which are incorporated by reference). In addition, nanoparticles of certain elements, such as copper are commercially available from a variety of vendors in the form of nano-powders.

The nanoparticles 102 are mixed together and with one or more chemicals 104 including but not limited to dispersants, surfactants, polymers, binders, cross-linking agents, emulsifiers, anti-foaming agents, dryers, solvents, fillers, extenders, thickening agents, film conditioners, anti-oxidants, flow agents, leveling agents, and corrosion inhibitors.

Dispersants (also called wetting agents) are surface-active substances used to prevent ultrafine flocculating particles from reaggregating, thus facilitating the suspension of solid compounding materials in a liquid medium and stabilizing the dispersion thereby produced. If particle surfaces attract one another, then flocculation occurs, resulting in aggregation and decreasing stability and/or homogeneity. If particle surfaces repel one another, then stabilization occurs, where fine particles do not aggregate and tend not to settle out of solution as fast.

An efficient dispersing agent can typically perform pigment wetting, dispersing, and stabilizing. Dispersing agents are different depending on the nature of the ink/paint. Polyphosphates, styrene-maleinates and polyacrylates are often used for aqueous formulations whereas fatty acid derivatives and low molecular weight modified alkyd and polyester resins are often used for organic formulations.

Surfactants are surface-active agents that lower the surface tension of the solvent in which they dissolve, serving as wetting agents, and keeping the surface tension of an (aqueous) medium low so that an ink interacts with a substrate surface. Certain types of surfactants are also used as dispersing agents. Surfactants typically contain both a hydrophobic carbon chain and a hydrophilic polar group. The polar group can be non-ionic. If the polar group is ionic, the charge can be either positive or negative, resulting in cationic or anionic surfactants. Zwitterionic surfactants contain both positive and negative charges within the same molecule; one example is N-n-Dodecyl-N,N-diemthyl betaine. Certain surfactants are often used as dispersant agents for aqueous solutions. Representative classes include acetylene diols, fatty acid derivatives, phosphate esters, sodium polyacrylate salts, polyacrylic acids, soya lecithin, trioctylphosphine (TOP), and trioctylphosphine oxide (TOPO).

Binders and resins are often used to hold together proximate particles in a nascent or formed dispersion. Examples of typical binders include acrylic monomers (both as monofunctional diluents and multifunctional reactive agents), acrylic resins (e.g. acrylic polyol, amine synergists, epoxy acrylics, polyester acrylics, polyether acrylics, styrene/acrylics, urethane acrylics, or vinyl acrylics), alkyd resins (e.g. long-oil, medium-oil, short-oil, or tall oil), adhesion promoters such as polyvinyl pyrrolidone (PVP), amide resins, amino resins (such as melamine-based or urea-based compounds), asphalt/bitumen, butadiene acrylonitriles, cellulosic resins (such as cellulose acetate butyrate (CAB)), cellulose acetate proprionate (CAP), ethyl cellulose (EC), nitrocellulose (NC), or organic cellulose ester), chlorinated rubber, dimer fatty acids, epoxy resin (e.g. acrylates, bisphenol A-based resins, epoxy UV curing resins, esters, phenol and cresol (Novolacs), or phenoxy-based compounds), ethylene co-terpolymers such as ethylene acrylic/methacrylic Acid, E/AA, E/M/AA or ethylene vinyl acetate (EVA), fluoropolymers, gelatin (e.g. Pluronic F-68 from BASF Corporation of Florham Park, N.J.), glycol monomers, hydrocarbon resins (e.g. aliphatic, aromatic, or coumarone-based such as indene), maelic resins, modified urea, natural rubber, natural resins and gums, rosins, modified phenolic resins, resols, polyamide, polybutadienes (liquid hydroxyl-terminated), polyesters (both saturated and unsaturated), polyolefins, polyurethane (PU) isocyanates (e.g. hexamethylene diisocynate (HDI), isophorone diisocyanate (IPDI), cycloaliphatics, diphenylmethane disiocyanate (MDI), toluene diisocynate (TDI), or trimethylhexamethylene diisocynate (TMDI)), polyurethane (PU) polyols (e.g. caprolactone, dimer-based polyesters, polyester, or polyether), polyurethane (PU) dispersions (PUDs) such those based on polyesters or polyethers, polyurethane prepolymers (e.g. caprolactone, dimer-based polyesters, polyesters, polyethers, and compounds based on urethane acrylate), Polyurethane thermoplastics (TPU) such as polyester or polyether, silicates (e.g. alkyl-silicates or water-glass based compounds), silicones (amine functional, epoxy functional, ethoxy functional, hydroxyl functional, methoxy functional, silanol functional, or cinyl functional), styrenes (e.g. styrene-butadiene emulsions, and styrene/vinyl toluene polymers and copolymers), or vinyl compounds (e.g. polyolefins and polyolefin derivatives, polystyrene and styrene copolymers, or polyvinyl acetate (PVAC)).

Emulsifiers are dispersing agents that blend liquids with other liquids by promoting the breakup of aggregating materials into small droplets and therefore stabilize the suspension in solution. For example, sorbitan esters are used as an emulsifier for the preparation of water-in-oil (w/o) emulsions, for the preparation of oil absorption bases (w/o), for the formation of w/o type pomades, as a reabsorption agent, and as a non toxic anti-foaming agent. Examples of emulsifiers are sorbitan esters such as sorbitan sesquioleate (Arlacel 60), sorbitan sesquioleate (Arlacel 83), sorbitan monolaurate (Span 20), sorbitan monopalmitate (Span 40), sorbitan monostearate (Span 60), sorbitan tristearate (Span 65), sorbitan mono-oleate (Span 80), and sorbitan trioleate (Span 85) all of which are available, e.g., from Uniqema of New Castle, Del. Other polymeric emulsifiers include polyoxyethylene monostearate (Myrj 45), polyoxyethylene monostearate (Myrj 49), polyoxyl 40 stearate (Myrj 52), polyoxyethylene monolaurate (PEG 400), polyoxyethylene monooleate (PEG 400 monoleate) and polyoxyethylene monostearate (PEG 400 monostearate), and the Tween series of surfactants including but not limited to polyoxyethylene sorbitan monolaurate (Tween 20), polyoxyethylene sorbitan monolaurate (Tween 21), polyoxyethylene sorbitan monopalmitate (Tween 40), polyoxyethylene sorbitan monostearate (Tween 60), polyoxyethylene sorbitan tristearate (Tween 61), polyoxyethylene sorbitan mono-oleate (Tween 80), polyoxyethylene sorbitan monooleate (Tween 81), and polyoxyethylene sorbitan tri-oleate (Tween 85) all of which are available, e.g., from Uniqema of New Castle, Del. Arlacel, Myrj, and Tween are registered trademarks of ICI Americas Inc. of Wilmington, Del.

Foam may form from the release of various gases during the coating/printing process, especially if the printing process takes place at high speeds. Surfactants may adsorb on the liquid-air interface and stabilize it, accelerating foam formation. Anti-foaming agents prevent foaming from being initiated, while defoaming agents minimize or eliminate previously-formed foam. Anti-foaming agents include hydrophobic solids, fatty oils, and certain surfactants, all of which penetrate the liquid-air interface to slow foam formation. Anti-foaming agents also include both silicate, silicone and silicone-free materials. Silicone-free materials include microcrystalline wax, mineral oil, polymeric materials, and silica- and surfactant-based materials.

Solvents can be aqueous (water-based) or non-aqueous (organic). While environmentally friendly, water-based solutions carry the disadvantage of a relatively higher surface tension than organic solvents, making it more difficult to wet substrates, especially plastic substrates. To improve substrate wetting with polymer substrates, surfactants are added to lower the ink surface tension (while minimizing surfactant-stabilized foaming), while the substrate surfaces are modified to enhance their surface energy (e.g. by corona treatment). Typical organic solvents include acetate, acrylates, alcohols (butyl, ethyl, isopropyl, or methyl), aldehydes, benzene, dibromomethane, chloroform, dichloromethane, dichloroethane, trichloroethane, cyclic compounds (e.g. cyclopentanone or cyclohexanone), esters (e.g. butyl acetate or ethyl acetate), ethers, glycols (such as ethylene glycol or propylene glycol), hexane, heptane, aliphatic hydrocarbons, aromatic hydrocarbons, ketones (e.g. acetone, methyl ethyl ketone, or methyl isobutyl ketone), natural oils, terpenes, terpinol, toluene.

Additional components may include fillers/extenders, thickening agents, rheology modifiers, surface conditioners, including adhesion promoters/bonding, anti-gelling agents, anti-blocking agents, antistatic agents, chelating/complexing agents, corrosion inhibitors, flame/rust inhibitors, flame and fire retardants, humectants, heat stabilizers, light-stabilizers/ UV absorbers, lubricants, pH stabilizers, and materials for slip control, anti-oxidants, and flow and leveling agents.

Figure 1B:
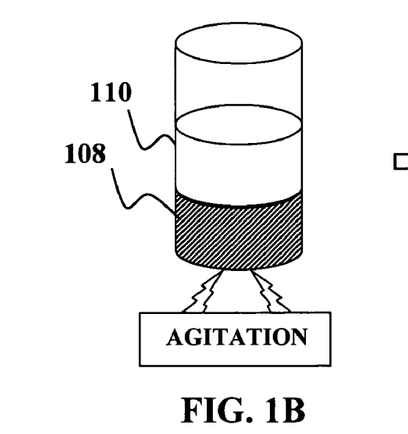
Figure 1C:
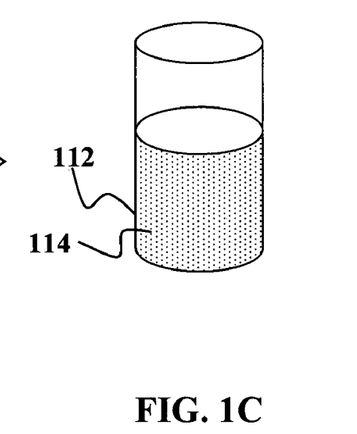
Figure 1D:
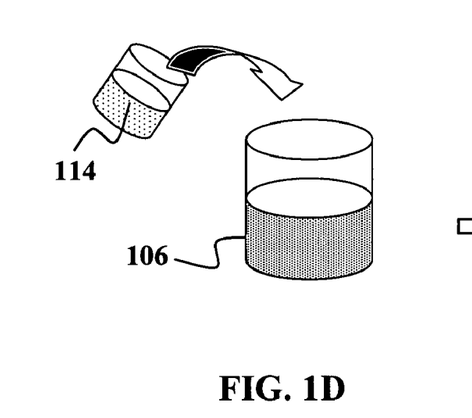
Figure 1E:
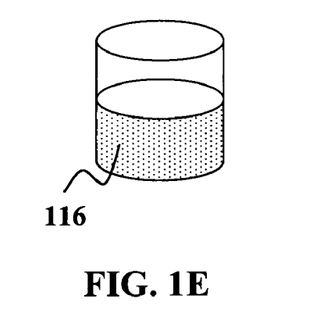

To provide gallium for the composition, gallium nanoglobules 114 are formed by initially creating an emulsion 112 of liquid gallium 108 in a solution 110 as shown in FIGS. 1B-1C. In particular, gallium metal or gallium metal in a solvent with or without emulsifier is heated to liquefy the metal, which is then sonicated and/or otherwise mechanically agitated in the presence of a solvent and optionally an emulsifier. Agitation can also be carried out either mechanically or electromagnetically in the presence of a solvent with or without a surfactant, dispersant, and/or emulsifier. As gallium emulsifies, nanoglobules 114 are formed in this environment. The gallium nanoglobules 114 can then be manipulated in the form of a solid-particulate, by quenching in an environment either at or below room temperature. When quenched, liquid gallium nanoglobules are converted to solid gallium nanoparticles. Techniques to modify the dispersion of liquid gallium in a solution include stirring, quenching, sonication, and/or the addition of melting point modifiers which can be used separately or in concert to reduce the size and/or narrow the size distribution of the Ga globules into a particular range within any of several spatial scales including but not limited to the nanoscale, sub-micron scale, and/or micron scale. Roughly spheroidal nanoglobules can be formed with average diameters ranging from about 10 nm to about 1000 nm. The gallium nanoglobules are then mixed with the nanoparticle mixture 106 as shown in FIG. 1D, forming a dispersion 116 as shown in FIG. 1E. Based on the relative ratios of the input elements, the gallium nanoglobule-containing dispersion 116 can then have a Cu/(In+Ga) compositional ratio ranging from 0.01 to 1.0 and a Ga/(In+Ga) compositional ratio ranging from 0.01 to 1.0.

Figure 2A:
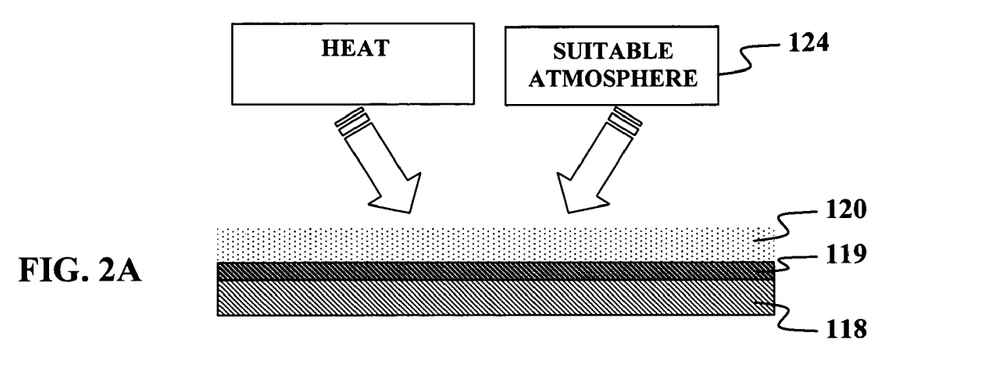
FIGS. 2A-2B are a sequence of cross-sectional schematic diagrams illustrating the formation of a compound film using the composition of matter according to an embodiment of the present invention.

To form a light-absorbing layer, the dispersion 116 may then be deposited onto a substrate 118 with a contact layer 119 to form a layer 120 as shown in FIG. 2A, using any of a variety of coating methods including but not limited to dip coating, spin coating, web coating, doctor blade coating, cup coating, spray coating, printing, and the like. The uniformity of film thickness of the layer 120 can be improved by use of any of a variety of printing techniques including but not limited to microgravure, reverse microgravure, comma, slot/ die coating, lip coating, and the like. The substrate 118 may be flexible, in the form of a metal foil (e.g. Al, Mo, Ti, or stainless steel), a plastic foil, or a metallized plastic foil, or the substrate may be rigid, e.g. a glass plate or other rigid surface. Where the substrate 118 is made of a metal such as aluminum, a contact layer 119 comprised of a different metal must be also present, e.g., molybdenum, which may be disposed between the substrate 118 and the film 120.

Figure 2B:
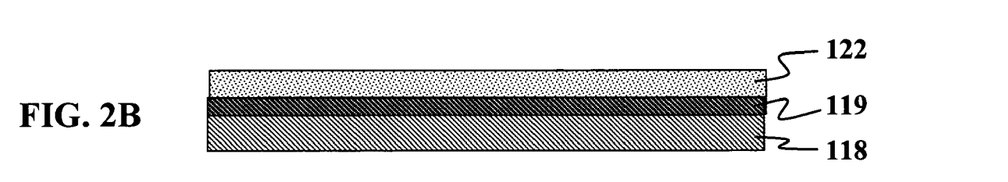

The layer 120 is then reacted in a suitable atmosphere to form a compound film 122. For example, upon printing, the layer 120 is then heated to remove any solvent and other added organic or volatile materials from the dispersion 116 and to anneal it into a compound film 122 as shown in FIG. 2B. During this step, in the case of a metal foil, the contact layer 119 inhibits the diffusion of metal or other contaminants from the substrate 118 into the compound film 122. Either during or after this heating step, the layer 120 (if during the heating step) or compound film 122 (if after the heating step) may be reacted in at least one suitable atmosphere 124. By way of example, the suitable atmosphere 124 may contain at least one of selenium, sulfur, or tellurium, and/or hydride gases comprising Se and/or S and/or Te, or mixtures of these gases.

Figure 2C:
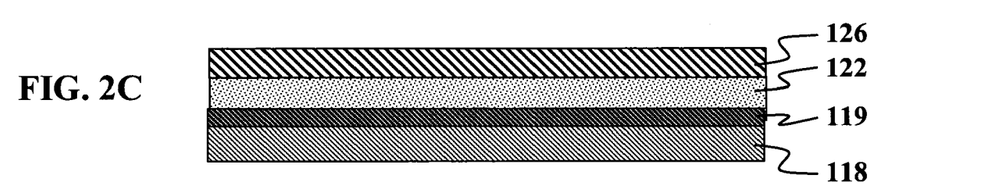
FIGS. 2C-2D are a sequence of cross-sectional schematic diagrams illustrating the fabrication of a photovoltaic device using the compound film according to an embodiment of the present invention.
Figure 2D:
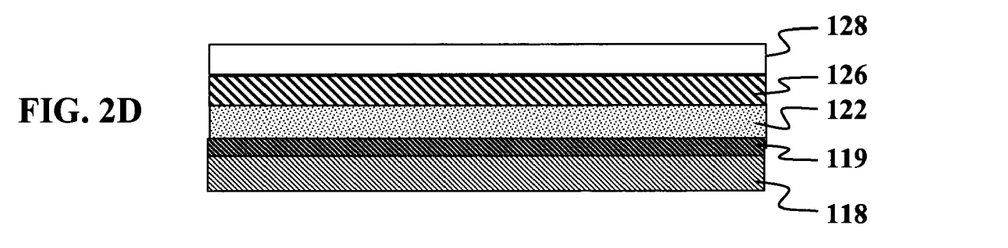

The compound film 122 may be used as the light-absorbing layer in a photovoltaic device. For example, as shown in FIG. 2C the window layer 126 may be deposited onto the compound film 122 as a junction partner between the compound film 122 and a transparent conducting layer 128 as shown in FIG. 2D. By way of example, the window layer 126 may include inorganic materials such as cadmium sulfide (CdS), zinc sulfide (ZnS), zinc hydroxide, zinc selenide (ZnSe), n-type organic materials, or some combination of two or more of these or similar materials. Layers of these materials may be deposited, e.g., by chemical bath deposition (CBD) or chemical surface deposition, to a thickness ranging from about 20 nm to about 1000 nm, more preferably from about 20 nm to about 500 nm, and most preferably from about 20 nm to about 300 nm.

The transparent conductive layer 128 may be inorganic, e.g., a transparent conductive oxide (TCO) such as indium tin oxide (ITO), fluorinated indium tin oxide, zinc oxide (ZnO) or aluminum doped zinc oxide, which can be deposited using any of a variety of means including but not limited to sputtering, evaporation, CBD, electroplating, sol-gel based coating, spray coating, chemical vapor deposition (CVD), physical vapor deposition (PVD), atomic layer deposition (ALD), and the like. Alternatively, the transparent conductive layer may include a transparent conductive polymeric layer, e.g. a transparent layer of doped PEDOT (Poly-3,4-Ethylenedioxythiophene), carbon nanotubes, or other transparent organic materials, either singly or in combination, which can be deposited using spin, dip, or spray coating, and the like. Combinations of inorganic and organic materials can also be used to form a hybrid transparent conductive layer.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A process of forming a compound film comprising the steps of:
heating elemental gallium to liquefy the elemental gallium;
agitating the elemental gallium suspended in solution to form liquid gallium nanoglobules;
quenching the liquid gallium nanoglobules to form solid nanoglobules of gallium with average diameters ranging from about 10 nm to about 1000 nm;
formulating a dispersion of elemental nanoparticles of the Ib, the IIIa, and, optionally, the VIa group of elements, wherein gallium is incorporated as a IIIa element in the form of a suspension of said solid nanoglobules; depositing said dispersion onto a substrate to form a layer on the substrate; and reacting the layer in a suitable atmosphere to form said compound film.

2. The process of claim 1, wherein said liquid elemental gallium is gallium nanoglobules are quenched below room temperature.

3. The process of claim 1, wherein said solid nanoglobules are solid-particulates.

4. The process of claim 1, further comprising maintaining or enhancing a dispersion of said liquid gallium in the solution by stirring, quenching, sonication, and/or the addition of dispersants and/or emulsifiers.

5. The process of claim 1, wherein the elemental nanoparticles of the Ib group of elements include copper.

6. The process of claim 1, wherein the elemental nanoparticles of the IIIa group of elements include indium.

7. The process of claim 1, wherein the elemental nanoparticles of the VIa group elements include selenium.

8. The process of claim 1, wherein said dispersion of elemental nanoparticles include aluminum, tellurium, or sulfur.

9. The process of claim 1, wherein the suitable atmosphere contains either selenium, sulfur, or tellurium, or combinations or blends of these.

10. The process of claim 1, wherein said nanoparticles have diameters of no more than about 500 nanometers.

11. The process of claim 1, wherein said nanoparticles have diameters of no more than about 100 nanometers.

12. The process of claim 1, wherein said nanoparticles have diameters of no more than about 50 nanometers.

13. The process of claim 1, wherein said formulating includes addition of one or more chemical additives.

14. The process of claim 13 wherein said one or more chemical additives is chosen from the group of dispersants, surfactants, polymers, binders, cross-linking agents, emulsifiers, anti-foaming agents, dryers, solvents, fillers, extenders, thickening agents, film conditioners, anti-oxidants, flow agents, leveling agents, and/or corrosion inhibitors.

15. The process of claim 1, wherein one or more classes of said nanoparticles are doped with one or more inorganic materials.

16. The process of claim 15, wherein the inorganic materials are chosen from the group of aluminum (Al), sulfur (S), sodium (Na), potassium (K), or lithium (Li).

17. The process or claim 1 wherein said compound film has a Cu/(In+Ga) compositional range of about 0.01 to about 1.0 and a Ga/(In+Ga) compositional range of about 0.01 to about 1.0.

18. The process of claim 1 wherein the nanoparticles have average diameters ranging from 10 nm to 500 nm.

19. The process of claim 1 wherein the nanoparticles have average diameters ranging from 10 nm to 100 nm.

20. The process of claim 1 wherein the solution includes a solvent with or without an emulsifier.

21. The process of claim 1 wherein the solution includes a solvent with or without a surfactant.

22. The process of claim 1 wherein depositing includes using at least one method from the group consisting of: dip coating, spin coating, web coating, doctor blade coating, cup coating, spray coating, printing, microgravure, reverse microgravure, comma, slot/die coating, lip coating, and the like.

23. The process of claim 1 wherein the substrate is flexible.

24. The process of claim 1 wherein the substrate is a plastic foil, or a metallized plastic foil.

25. A process of forming a compound film of a photovoltaic device comprising the steps of:
heating elemental gallium to liquefy the elemental gallium;
agitating the elemental gallium suspended in solution to form liquid gallium nanoglobules;
quenching the liquid gallium nanoglobules to form solid nanoglobules of gallium with average diameters ranging from about 10 nm to about 1000 nm;
formulating a dispersion of elemental nanoparticles of the Ib, the IIIa, and, optionally, the VIa group of elements, wherein gallium is incorporated as a IIIa element in the form of a suspension of said solid nanoglobules; depositing said dispersion onto a metal foil substrate to form a layer on the substrate; and reacting the layer in a suitable atmosphere to form said compound film.

26. The process of claim 25 wherein the substrate is selected from the group consisting of: stainless steel, Al, Mo, and Ti.

27. The process of claim 25 further comprising a contact layer comprised of a different metal than the substrate and disposed between the substrate and the film.

28. The process of claim 25 wherein the contact layer comprises molybdenum.

29. The process of claim 25 further comprising depositing a window layer on the semiconductor film.

30. The process of claim 29 wherein the window layer comprises cadmium sulfide (CdS), zinc sulfide (ZnS), zinc hydroxide, zinc selenide (ZnSe), n-type organic materials, or some combination of two or more of these or similar materials.

31. The process of claim 29 wherein the window layer is deposited by chemical bath deposition (CBD) or chemical surface deposition.

32. The process of claim 29 wherein the window layer has a thickness ranging from about 20 nm to about 1000 nm.

33. The process of claim 29 further comprising depositing a transparent conductor of indium tin oxide (ITO), fluorinated indium tin oxide, zinc oxide (ZnO), aluminum doped zinc oxide, a transparent conductive polymeric layer, a transparent layer of doped PEDOT (Poly-3,4-Ethylenedioxythiophene), carbon nanotubes, or other transparent organic materials, either singly or in combination.

34. The process of claim 29 further comprising depositing a hybrid transparent conductor comprised of inorganic and organic materials.

35. A process of forming a compound film of a photovoltaic device comprising the steps of:
heating elemental gallium to liquefy the elemental gallium;
agitating the elemental gallium suspended in solution to form liquid gallium nanoglobules;

quenching the liquid gallium nanoglobules to form solid nanoglobules of gallium with average diameters ranging from about 10 nm to about 1000 nm;

formulating a dispersion of elemental nanoparticles of the Ib, the IIIa, and, optionally, the VIa group of elements, wherein gallium is incorporated as a IIIa element in the form of a suspension of said solid nanoglobules; depositing said dispersion onto a substrate to form a layer on the substrate; annealing the layer on the substrate, and reacting the layer in a suitable atmosphere to form said compound film.

36. The process of claim 35 wherein reacting occurs during the annealing step.

37. The process of claim 35 wherein reacting occurs after the annealing step.

38. The process of claim 35 wherein said suitable atmosphere comprises selenium, sulfur, tellurium, and/or hydride gases comprising Se and/or S and/or Te, or mixtures of these gases.

* * * * *